United States Patent [19]

Kitamura et al.

[11] Patent Number: 4,746,804
[45] Date of Patent: May 24, 1988

[54] PHOTOSENSITIVE PIXEL WITH EXPOSED BLOCKING ELEMENT

[75] Inventors: Koichi Kitamura, Troy; Louis D. Swartz, Holly; Clive Catchpole, Birmingham; Zvi Yaniv, Farmington Hills, all of Mich.

[73] Assignee: Ovonic Imaging Systems, Inc., Troy, Mich.

[21] Appl. No.: 93,842

[22] Filed: Sep. 8, 1987

Related U.S. Application Data

[63] Continuation of Ser. No. 907,926, Sep. 16, 1986, Pat. No. 4,714,836.

[51] Int. Cl.$^4$ .............................................. H04N 3/14
[52] U.S. Cl. ..................................... 250/578; 357/30; 358/213.11; 358/213.15
[58] Field of Search ............... 250/578, 211 R, 211 J; 357/30 H; 358/212, 213.11, 213.15

[56] References Cited

U.S. PATENT DOCUMENTS

| | | | |
|---|---|---|---|
| 4,482,804 | 11/1984 | Oritsuki et al. | 250/578 |
| 4,565,928 | 1/1986 | Yamamoto et al. | 250/578 |
| 4,607,168 | 8/1986 | Oritsuki et al. | 250/578 |
| 4,675,739 | 6/1987 | Catchpole et al. | 358/213.11 |

Primary Examiner—Edward P. Westin
Attorney, Agent, or Firm—Marvin S. Siskind; Richard M. Goldman

[57] ABSTRACT

By maintaining the first electrodes of a photogenerative element and a current blocking element at a common potential while electrically interconnecting the second electrodes thereof, the blocking element need not be masked from incident radiation because the stored electrical signal generated by the photogenerative element will not be dissipated by photogenerated carrier pairs contributed by the current blocking element.

21 Claims, 3 Drawing Sheets

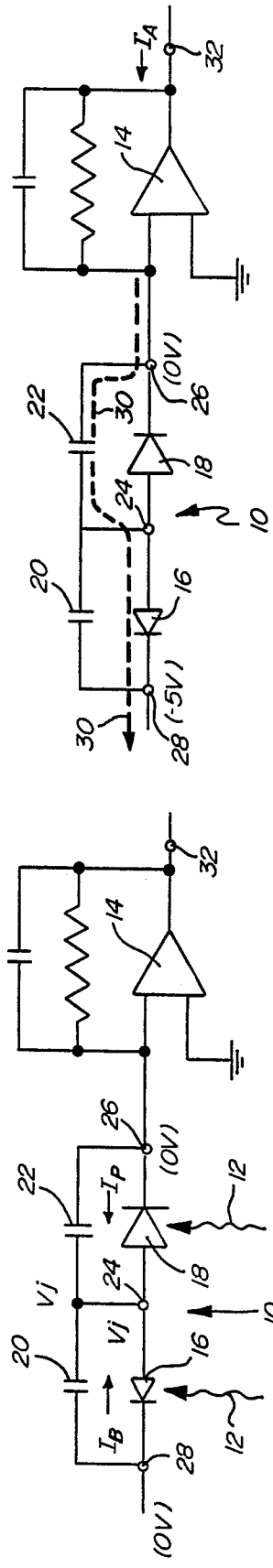
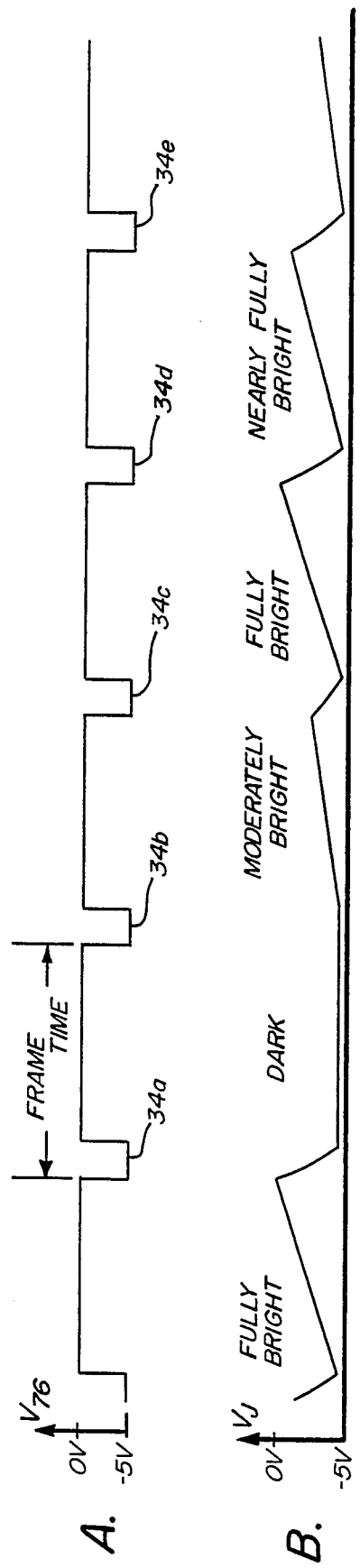

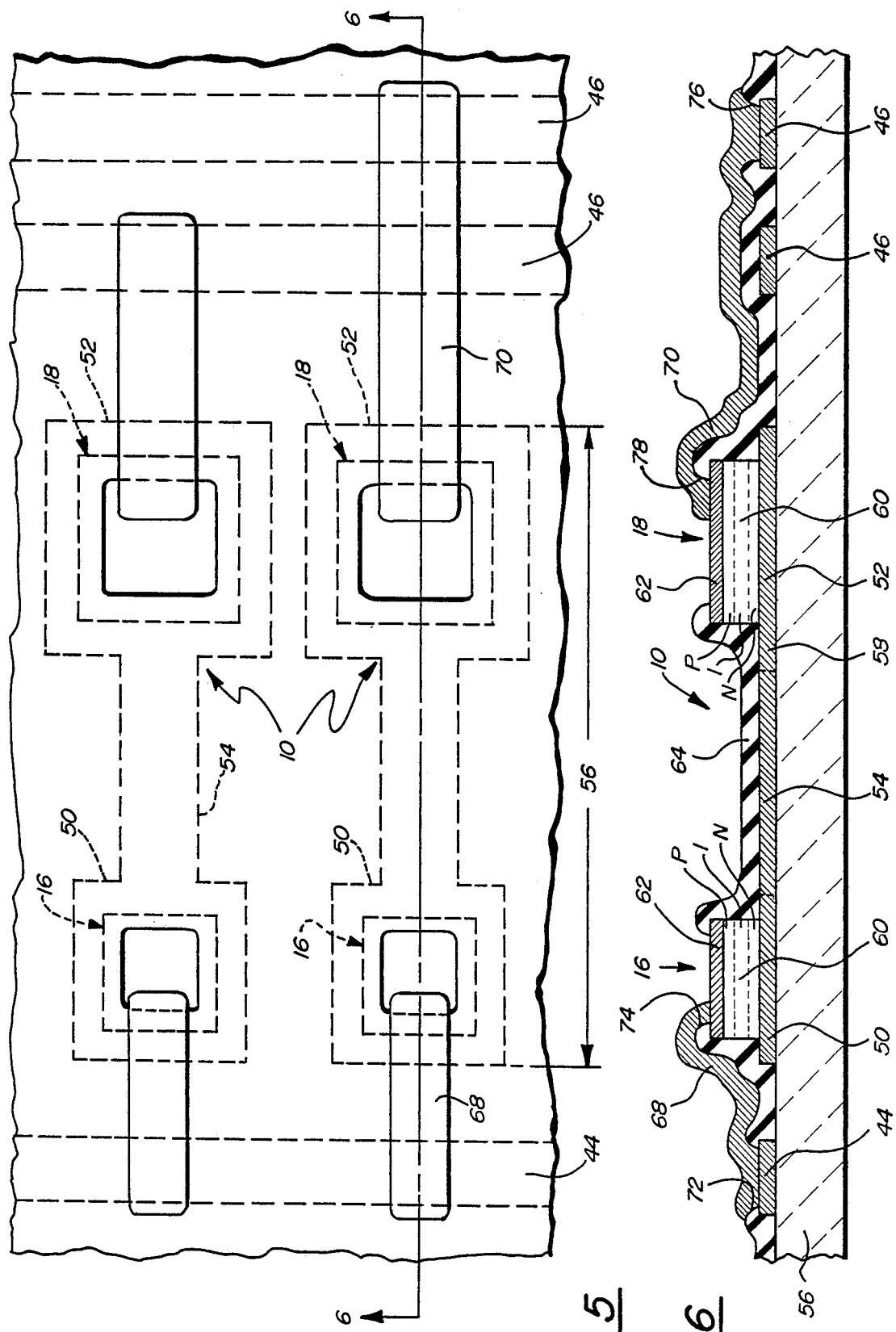

PHOTOSENSITIVE PIXEL WITH EXPOSED BLOCKING ELEMENT

This application is a continuation of application Ser. No. 907,926, filed on Sept. 16, 1986, now U.S. Pat. No. 4,714,836.

FIELD OF THE INVENTION

This invention relates to photosensitive arrays and, more particularly, to an integrated array of thin film photogenerative elements and an improved addressing scheme to read the signals photogenerated by the elements with a minimum of cross-talk therebetween.

BACKGROUND OF THE INVENTION

Image or optical scanners are enjoying ever-growing utility in a variety of products and for a diversity of applications. For the purpose of understanding the subject invention "image or optical scanners" are defined as including of one or more photoresponsive circuits or elements disposed to optically scan a pattern of data and produce a signal representative thereof.

Optical scanners may be readily adapted to address a wide variety of data inputs. The data may be in the form of a photograph, a drawing, a design on fabric or the like or any other such graphic patterns. In other instances, the data being scanned may be alpha-numeric data such as printed or written matter. Basically, image scanners convert a pattern of data into an electrical signal which may be supplied to downstream apparatus for further processing, storage or display. Image scanners are incorporated into facsimile machines, copying machines, computer input terminals, CAD-CAM systems and the like. Additionally, image scanners are utilized in production processes to inspect surfaces of materials such as plywood, fabric, and metal. The typical image scanner includes one or more photoresponsive circuits disposed so as to either simultaneously, or sequentially address various portions of the surface being scanned.

There are several approaches currently employed for the fabrication of image scanners. Charge coupled devices (CCD's) form the basis for one such approach. CCD's are solid state devices, typically formed from crystalline silicon and including therein a plurality of photoresponsive circuits each having a pixel associated therewith. CCD's have a high degree of photosensitivity and are capable of providing high resolution. However, CCD's are relatively small in size; the typical CCD array is approximately one inch in length, and the largest CCD's currently produced are approximately 3 to 4 inches in length. These size constraints impose restrictions on the utility of CCD's in scanners. In those instances where a pattern of information having dimensions larger than that of the CCD is being scanned, an optical system must be utilized to project that pattern of information at a reduced size onto the surface of the CCD. Aside from being expensive and bulky, such optical systems will effectively reduce the resolution of the CCD.

Thin film devices represent another approach to the fabrication of image scanners. Thin film devices may be formed by vapor deposition of layers of appropriate semiconductor materials onto a variety of substrates. By appropriately patterning these layers, a variety of device configurations may be fabricated.

Recently, considerable progress has been made in developing processes for depositing thin film semiconductor materials. Such materials can be deposited to cover relatively large areas and can be doped to form p-type and n-type semiconductor materials for the production of semiconductor devices such as p-i-n type photodiodes equivalent, and in some cases superior to those produced by their crystalline counterparts. One particularly promising group of thin film materials are the amorphous materials. As used herein, the term "amorphous" includes all materials or alloys which have long range disorder although they may have short or intermediate range order, or even contain at times, crystalline inclusions. Also as used herein, the term "microcrystalline" is defined as a unique class of said amorphous materials characterized by a volume fraction of crystalline inclusions, said volume fraction of inclusions being greater than a threshold value at which the onset of substantial changes in ceratin key parameters such as electrical conductivity, band gap and absorption constant occur.

It is now possible to prepare by glow discharge, or other vapor deposition processes, thin film amorphous silicon, germanium or silicon-germanium alloys in large areas, said alloys possessing low concentrations of localized states in the energy gap thereof and high quality electronic properties. Techniques for the preparation of such alloys are fully described in U.S. Pat. Nos. 4,226,898 and 4,217,374 of Stanford R. Ovshinsky, et al., both of which are entitled "Amorphous Semiconductor Equivalent to Crystalline Semiconductors" and in U.S. Pat. Nos. 4,504,518 and 4,517,223 of Stanford R. Ovshinsky, et al., both of which are entitled "Method of Making Amorphous Semiconductor Alloys and Devices Using Microwave Energy"; the disclosures of all of the foregoing patents are incorporated herein by reference.

Thin film alloys may be readily manufactured in large araeas by mass production processes and therefore enable the economic manufacture of large scale image sensor arrays. Use of such large arrays eliminates the need for complicated optical systems thereby effecting savings in cost, product size and processing steps. Additionally, since the thin film sensor arrays are fabricated to be of approximately the same size as the object being scanned, relatively high resolution may be attained without the necessity of employing high resolution photolithographic processing steps. It may thus be seen that thin film photosensor arrays have significant utility in the fabrication of image scanners.

Typcial thin film image scanners include an array of photoresponsive circuits, each of which incorporate therein a photogenerative element adapted to provide an electrical signal corresponding to the quantity of light incident thereupon. It would be very time consuming to utilize a signal element for scanning, accordingly, an array of elements in either linear or two dimensional form is typically utilized. In those instances where such an array is employed, each photosensitive circuit of the array must also include a blocking element such as a diode or transistor. The blocking element facilitates addressing of the various photogenerative elements in the matrix by preventing current flows through unwanted paths in the matrix. In this manner, the blocking device eliminates cross talk which would otherwise degrade the signal produced by the photosensitive element.

Problems occurred in the use of prior art photosensitive arrays becasue of the generation of charge carrier pairs within the blocking element thereof due to the absorption of incident illumination. Light having an energy greater than the band gap of the semiconductor material from which the blocking element is fabricated is capable of generating an electron-hole pair in that material. If a field is present across the semiconductor material, the photogenerated electron-hole pair is separated, thereby producing a flow of electrical current. Heretofore, such illumination of the blocking element was capable of producing a flow of electrical current which would effectively be a source of "noise" which dissipated or otherwise degraded the signal produced by and hence the sensitivity of the photogenerative elements. For this reason, it has heretofore been necessary to optically mask the blocking element so as to prevent the illumination thereof.

Such masking had been accomplished by depositing a relatively thick, opaque layer of metal or the like upon the blocking elements, or by utilizing a tape or other shield to prevent illumination. This approach is obviously less than satisfactory insofar as it necessitates extra processing steps. For example, depositing a metal layer requires great care if short circuiting is to be prevented. Use of a separately applied tape or other masking element necessitates disposing the blocking element relatively far from the photogenerative element so as to provide sufficient tolerances for placement of the masking member. Such remote placement wastes space which reduces resolution and furthermore requires the use of relatively lengthy connectors therebetween, which connectors add undesired capacitance to the circuit.

Accordingly, it can be seen that it would be highly desirable to eliminate the need for masking the blocking element from radiation incident thereupon insofar as such masking steps risk harm to the subjacent elements, increase cost, waste processing time, materials, and adversely increase the size and electrical capacitance of the photosensitive pixels.

The instant invention therefore provides for the fabrication of a photoresponsive circuit which includes a photogenerative element and a blocking element and in which there is no need for masking the blocking element from incident radiation.

These and other advantages of the present invention will be readily apparent from the summary of the invention, the drawings, the description of the drawings and the claims which follow.

BRIEF SUMMARY OF THE INVENTION

There is disclosed herein a circuit for providing a detectable signal corresponding to the quantity of radiation incident thereupon. The circuit comprises a photogenerative element including at least first and second electrodes; and an element for selectively blocking current flow through at least a portion of the circuit, said element including at least first and second electrodes; the first electrode of the photogenerative element and the first electrode of the blocking element being electrically interconnected while the second electrode of the photogenerative element and the second electrode of the blocking element are held at a substantially common potential whereby the detectable signal will not be dissipated by carrier pairs photogenerated by said current blocking element.

The photogenerative element may be a photoresistor, a phototransistor or a photodiode. When the photogenerative element takes the form of a photodiode it will include oppositely doped layers formed of thin film semiconductor alloy material between which a substantially intrinsic semiconductor alloy material is interposed so as to form a p-i-n type photodiode. In the most preferred embodiment, the semiconductor layers of the photodiode are formed from a material selected from the group consisting essentially of amorphous silicon alloy materials, amorphous germanium alloy materials and amorphous silicon:germanium alloy materials. The photogenerative element may include a pluralit of p-i-n type photodiodes stacked in optical and electrical series relationship.

The blocking element, in a preferred embodiment, includes a layer of photoresponsive semiconductor alloy material capable of generating charge carrier pairs in response to the absorption of incident radiation. The blocking element may be a transistor or a diode. When the blocking element takes the form of a diode, it may include a pair of oppositely doped layers of thin film semiconductor alloy material between which a layer of intrinsic semiconductor alloy material is interposed so as to form a p-i-n type diode. The p-i-n type diode is formed from layers of semiconductor alloy materials selected from the group consisting essentially of amorphous silicon alloy materials, amorphous germanium alloy materials and amorphous silicon:germanium alloy materials. The diode may comprise a plurality of stacked p-i-n type diodes disposed in optical and electrical series relationship. The diode might also take the form of a Schottky barrier. However, the blocking means is substantially unshielded from incident radiation.

In a preferred form, a low impedance current amplifier is adapted to maintain the second electrode of the photogenerative element and the second electrode of the current blocking means at a substantially equal potential such as 0 volts. The photogenerative element is preferably a photodiode having an anode and a cathode, the blocking element is preferably a blocking diode having an anode and a cathode with the cathodes of the two diodes electrically interconnected by an electrical conductor so that upon exposure of the photodiode to radiation, an electrical signal in the form of photogenerated carrier pairs will be stored on said electrical conductor and the anodes of the photodiode and the anode of the blocking diode are maintained at substantially similar electrical potentials while the circuit is exposed to radiation.

By utilizing a plurality of photodiodes and a plurality of associated blocking diodes operatively disposed and arranged, the circuit can be used to provide an array of pixels adapted to provide a plurality of electrical signals corresponding to the quantity of radiation incident thereupon. The array of pixels may either be linear or two dimensional.

In a preferred embodiment, a supporting substrate, having at least one conductive surface, is provided. The photodiode and the blocking diode are spacedly disposed upon the electrically conductive surface with the cathodes thereof in electrical communication with the electrically conductive surface so as to establish electrical communication therebetween. The circuit further includes a first transparent conductor overlying the anode of the photodiode, a second transparent conductor overlying the anode of the blocking diode and an electrical conductor contacting a portion of the first transparent conductor and a portion of the second transparent conductor.

It is further contemplated that the scope of the present invention includes a current blocking element for use in a photoresponsive circuit, said circuit including a photogenerative element and adapted to provide and store a detectable signal corresponding to th quantity of radiation incident thereupon. The circuit further includes an element adapted to selectively block current flow therethrough. The blocking element comprises in combination: a surface substantially unshielded from radiation incident upon said circuit so that the photogenerative region thereof is at least partially accessible to said radiation. Again, this embodiment of photogenerative element may be a photoresistor, a phototransistor, a photodiode; however, it is contemplated that both the photogenerative element and the blocking element be formed from one or more triads of p-i-n type layers of semiconductor alloy material. Also, the second electrode of the photogenerative element and the second electrode of the current blocking element are maintained at a substantially equal potential of about 0 volts by a low impedance current amplifier while the first electrodes thereof are electrically interconnected. By employing a plurality of associated photodiodes and blocking diodes which are operatively disposed and arranged to form an array, the electrical signals generated by said array will correpsond to light emanating from an image being sensed whereby an image sensor is provided.

BRIEF DESCRIPTION OF THE DRAWINGS

FIGS. 1A through 1B illustrate, in schematic fashion, the preferred method of reading the signal photogenerated by the photosensitive pixel of the instant invention;

FIG. 2 illustrates a timing diagram relating to the method of reading the signals photogenerated by the photosensitive pixel of the instant invention shown in FIGS. 1A and 1B;

FIG. 5 is a top plan view illustrating electrical connections of the photosensitive pixels into an array as contemplated by the instant invention; and FIG. 6 is a cross-sectional side view of one of the individual photosensitive pixels illustrated in Figure 5.

DETAILED DESCRIPTION OF THE PREFERRED EMBODIMENTS

Figure 4:
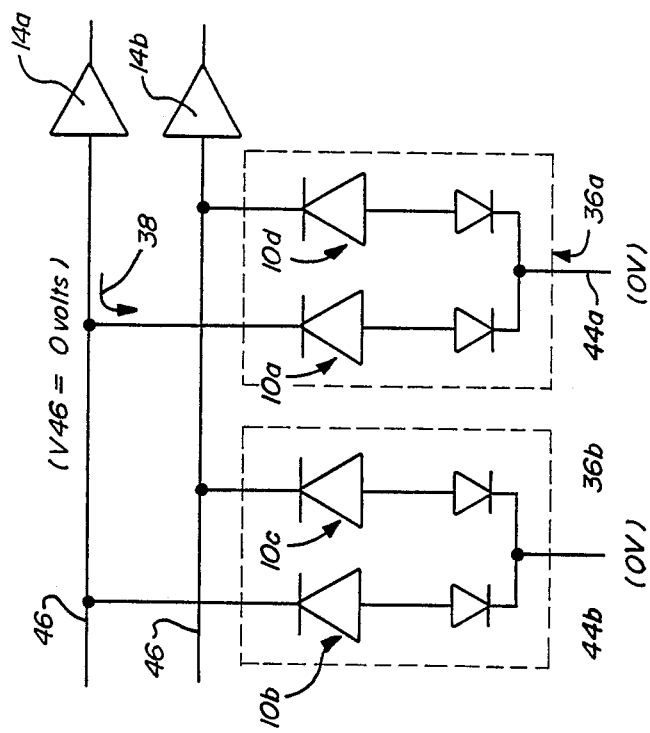
FIG. 4 illustrates, in schematic form, the technique of reading photosensitive pixels without cross-talk.

The instant invention will best be understood with reference to the drawings. FIGS. 1A and 1B illustrate a preferred method of, and circuit for, reading the signal generated by an individual photosensitive circuit during the operation of an array of photosensitive pixels. As used herein the terms "photosensitive circuit" or "photoresponsive circuit" shall refer to that portion of a photosensitive array associated with an individual pixel, and typically includes a photogenerative element adapted to provide a detectable signal in response to the absorption of incident illumination, a blocking element adapted to selectively restrict current flow through portions of the circuit and the associated addressing means. FIG. 1A represents a photosensitive pixel 10 adapted to receive incident radiation 12, while FIG. 1B represents the photosensitive pixel 10 being read by output amplifier 14. At may be seen by reference to FIGS. 1A and 1B, photosensitive pixel 10 comprises two diodes, a blocking diode 16 and a photodiode 18 electrically connected in back-to-back series fashion. For convenience in explaining the operation of photosensitive pixel 10, the internal capacitances 20 and 22 of diodes 16 and 18, respectively, are shown in Figure 1A and 1B separate components. The anodes of diodes 16 and 18 are connected to a common point or node 24. The cathode of the photodiode 18 is connected to an output node 26 while the cathode of blocking diode 16 is connected to an input node 28.

Both diodes 16 and 18 may be, and preferably are, manufactured and operation so that they respectively generate an electric current $I_B$ and $I_P$, when exposed to light during operation. In this regard, each diode may be thought of as a miniature solar cell, the energy output thereof per scanning cycle being proportional to the total amount of radiation incident thereupon during the scanning cycle. It should be noted that since the photosensitive pixel 10 effectively integrates the total charge produced by incident light thereon over each scanning cycle, it is more sensitive than those prior art photosensitive element which measure incident light on a solely instantaneous basis. The signal amplifier 14 is adapted to create an amplified output signal proportional to the current passing through node 26 when the photosensitive pixel 10 is read.

It is an important feature of the instant invention that the voltage at node 26 and at node 28 be maintained at substantially the same value during the sense (i.e. non-read) portion of the cycle. This prevents any photocurrent generated during illumination of the blocking diode 16 from dissipating or otherwise degrading the photocurrent produced by the photodiode 18 and stored at node 24. For this reason, the blocking diode 16 need not be masked from incident light, thereby simplifying pixel design and processing steps. The voltage at node 26 between the photodiode 18 and the amplifier 14 and the voltage at the input node 28 are both preferably maintained at zero volts whenever the photosensitive pixel 10 is not being read, as indicated in FIG. 1A, although other common voltage values may be similarly utilized.

Accordingly, when diodes 16 and 18 are exposed to light, as indicated in FIG. 1A, they respectively generate photocurrents $I_B$ and $I_P$, which currents are directed toward node 24, thereby causing the junction voltage $V_J$ to be less negative than the negative voltage placed on node 24 the last time the photosensitive pixel 10 was read.

As indicated in FIG. 1B, in order to read the integrated charge produced by incident light falling upon photosensitive pixel 10, the voltage at input node 28 is decreased, for example from zero volts to $-5$ volts. The blocking diode 16 is thus rendered conductive and passes current until the voltage at node 24 is about equal to $-5$ volts.

In practice, the built-in potential of the diode 16 may prevent the voltage at node 24 from reaching the voltage applied to the input node 28. This charge in voltage at node 24 is accompanied by a current flow indicated by dashed line 30. The photodiode 18 is reversed biased at this time, and depending upon the duration of the reading pulse, will experience a final reverse bias voltage of nearly $-5$ volts. At times, it is useful to consider this reverse current flow 30 as passing through internal capacitance 22 of the photodiode 28, thereby charging capacitor 22 to 5 volts. On the other hand, blocking diode 16 is forward biased, thus allowing its internal capacitance 20 to effectively discharge, that is, the voltage across internal capacitance 20 will be equal to the final forward voltage drop achieved across the diode 16. The current flow 30 which passes through node 26 is amplified by the signal amplifier 14, and produces an amplified current $I_A$ which passes through output node 32 and is proportional to the light intensity received during the current scanning cycle by photosensitive pixel 10. At the end of the scanning pulse, the voltage at input node 28 is returned to zero volts, and the voltage $V_J$ at node 24 remains at nearly $-5$ volts unless the photosensitive pixel 10 is subjected to further incident radiation. Finally, node 26 is returned to zero volts and the circuit is reset in the sense mode.

FIGS. 2A through 2C comprise a timing chart of three waveforms collectively illustrating the time response of the output of a photosensitive pixel, such as 10, in response to light of varying intensity. The first waveform in FIG. 2A shows the $-5$ volt driving pulses placed at input 28 in FIG. 1B. One skilled in the art will appreciate that the duration of time interval and frame time may be varied to accomodate differing time responses and the number of photosensitive pixels to be addressed.

The waveform shown in FIG. 2B shows the corresponding voltage $V_J$ produced at node 24 in the photosensitive pixel 10 of FIG. 1B when it successively encounters consecutive segments of the image to be scanned which have full brightness, full darkness, intermediate brightness, full brightness, and nearly full brightness, respectively. As shown, in encountering a fully bright segment of the image, the voltage $V_J$ at node 24 increases from nearly $-5$ volts to nearly zero volts. At the end of this first charging period, the input pulse 34a causes this voltage to return from nearly zero volts to $-5$ volts. Correspondingly, the output current signal, shown in FIG. 2C, measures the current through the blocking diode 16.

Figure 3:
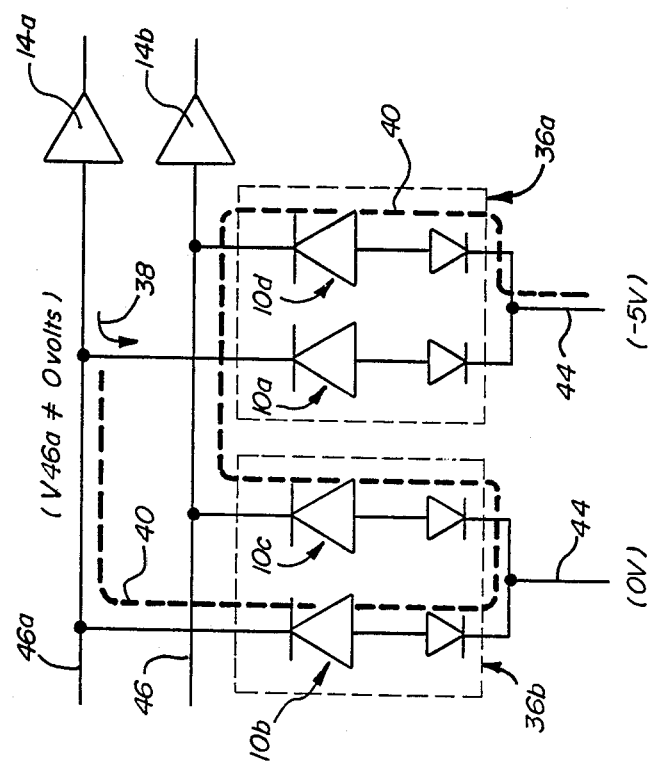
FIG. 3 illustrates, in a schematic form, electrical cross-talk occurring between adjacent groups of photosensitive pixels of the prior art.

In the next scanning cycle or frame where the image encountered is dark, no significant photocurrents are generated, and accordingly, the voltage $V_J$ at junction node 24 does not change at the occurrence of the read-out pulse 34b. Where the image may consist of segments producing brightness levels intermediate to, that is, between dark and fully bright, the photocurrents generated will have values intermediate 0 and $-5$ volts and an intermediate change in voltage at node 24 is experienced. During the next read-out pulse 34c, only a moderate voltage change is generated at node 24 and a moderate output is produced at node 32 as correspondingly shown in FIG. 3C.

The read-out scheme just described possesses significant advantages over other read-out techniques known in the art. One such advantage is in the virtual elimination of electrical cross-talk due to undesired current leakage through other elements in electrical communication therewith. The reason for this result may be explained by reference to FIG. 3, where for the purposes of clarity and ease of discussion, a prior art linear array, consisting of two photosensitive circuits or groups 36a and 36b having two photosensitive elements each, is shown. Amplifier 14a, when connected as shown, serves to sense the current generated by either photosensitive pixel 10a of group 36a or of photosensitive pixel 10b of group 36b, depending upon which group is being interrogated. In practice, the total current sensed by the amplifier 14a when reading the photosensitive element 10a is the sum of the currents passed through a plurality of current paths including the current 38 from the photosensitive element 10a and the additional leakage current 40 which passes through the pixels 10b and 10c of the unselected group 36b, and through another of the pixels 10d in selected group 36a in a route indicated by heavy dashed line 40. Such currents are created by the variance in operating characteristics among photosensitive pixels 10 and the fact that the output lines 46 are not maintained at zero volts. In a large photosensitive array having dozens of hundreds of groups of pixels this unwanted cross-talk current can adversely affect the accuracy of the readings of the individual photosensitive pixels 10. In the present invention, however, where input lines 46 and output lines 44 are maintained at substantially similar potentials, cross-talk currents generated by and passing through the photosensitive pixels 10 of unaddressed groups of pixels do not exist. Therefore, the current required to recharge each pixel 10 is detected only by its corresponding amplifier 14.

FIG. 4 is a simplified schematic diagram of the preferred mode of addressing and reading the photosensitive pixels 10 of the present invention. As illustrated, all output lines 46 as well as all input lines 44 are held at zero volts, thereby eliminating undesired leakage currents. Since the individual photosensitive pixels 10 in non-addressed groups are at the same voltage, no current will be passed through these non-addressed pixels. This effectively prevents cross-talk since there are no effective paths, i.e., a path having a voltage drop, through which such cross-talk currents are driven. Those in the art will appreciate that this preferred method of reading an array such as a linear array of photosensitive pixels also eliminates the need to closely match the I-V characteristics of all blocking diodes and of all photodiodes.

FIG. 5 is a top plan view of two adjacent photosensitive pixels 10 and associated output lines 46 and input line 44. FIG. 6 is a corresponding cross-sectional side view of one of the photosensitive pixels 10 taken along line 6—6 of FIG. 5. FIGS. 5 and 6 illustrate that the photosensitive pixels 10, the input line 44 and the output lines 46 can be formed as a single integrated structure using well known techniques for depositing thin film semiconductor alloy material, insulators and conductive lines, and patterning same using conventional photolithographic techniques. As is suggested by FIG. 5, a photosensitive array may comprise a plurality of photosensitive pixels 10 spacedly disposed adjacent and parallel to one another. For an array, the approximate dimensions of the photosensitive pixels 10, which are identical, may be as follows. The center to center spacing between adjacent pixels 10 in any direction may be about 60 microns. The photodiodes 18 may be formed as a square having sides of approximately 42 microns each and the blocking diodes 16 may be formed as a square having sides of approximately 24 microns each. The blocking diode 18 may be located on top of a suitable conductive base 50 about 30 microns square, which base serves as one of its electrodes; while the photodiode 18 may be located upon a suitable conductive base 52 about 52 microns square, which base serves as one of its electrodes. Conductive bases 50 and 52 are preferably interconnected by a conductive connector 54. The overall longitudinal dimension 56 of the photosensitive pixel 10 may be approximately 250 microns. Because the photocurrent generated by each of the photodiodes 18 is proportional to the diode area, an array having greater sensitivity may be created when the photodiode 18 is increased in size. However, as is readily seen from FIG. 5, an increase in the size of each photodiode will affect the resolution of the resulting array. Furthermore, if the blocking diode is made too large relative to the photodiode, excess capacitance may be added to the circuit, which capacitance will be detrimental to the operation thereof. Consequently, it has been found desirable to have the photodiode cover an area which is at least five times and preferably ten times greater than the area of the blocking diode.

FIG. 6 shows that the photosensitive pixel 10 may be formed on an insulating substrate 56, which substrate is preferably Corning 7059 glass, but may be formed from any other suitable material, such as stainless steel coated with an insulating layer. Formed on top of substrate 56 is a bottom metal layer 58, which may be chromium, said layer 58 subsequently photolithographically patterned using conventional techniques to form a patterned metallic layer under each photosensitive pixel 10 and to simultaneously form input line 44 and output lines 46. The patterned metal layer 58 forms the conductive bases 50 and 52, which bases respectively serve as one of the electrodes for the diodes 16 and 18. They metal layer 58 also forms conductive connector 54 interconnecting the two bases. Next, layers of N-I-P semiconductor alloy material 60 are deposited upon bases 50 and 52 so as to form the photogenerative portions of diodes 16 and 18. Placed over each of the layers 60 is a discrete top contact 62, said top contact preferably being made from transparent conductive oxides such as idium tin oxide (ITO). An insulating layer 64 is then deposited and patterned in order to insulate conductive lines or traces 68 and 70 from electrically communicating with other portions of the arry, except where desired. For example, conductive line 68 contacts input line 44 through via 72 and is electrically connected to contact 62 of the blocking diode 16 through via 74. Similarly, conductive line 70 contacts output line 46 through via 76 and is electrically connected to the top contact 62 of the photodiode 18 at via 78.

It will be appreciated that conductive connector 54 of bottom conductive layer 58 causes photodiodes 16 and 18 to be electrically connected in back-to-back communication, while the top metal conductive lines 68 and 70, respectively, provide the electrical connection to the electrodes of the diodes 16 and 18 opposite the bottom connecting layer 58.

In prior art structures it was necessary to cover the blocking or isolation diode 16 with a metal or other opaque layer to prevent it from being affected by incident light so as to avoid the generation of current which produced increased noise in the output of the photosensitive circuit, thereby decreasing the sensitivity thereof. In the present invention, however, it is not necessary to mask the blocking diode 70 from incident light.

As shown by the preceeding discussion, the instant invention provides a novel addressing scheme allowing for the fabrication of photosensitive arrays which do not require light shielding of the blocking elements thereof and which exhibit reduced electrical cross-talk between the pixels thereof.

While preferred embodiments of the present invention has been disclosed in detail, it is to be appreciated that those skilled in the art may make various modifications and changes without departing from the spirit of the instant invention. For example, elements other than diodes may be substituted for the blocking and photogenerating elements; the principles hereof being equally applicable to circuits including thin film transistors, crystalline transistors and the like. It is the following claims, including all equivalents which are meant to define the scope of the instant invention.

What is claimed is:

1. A photoresponsive pixel for generating a signal indicative of the radiation emanating from an image-bearing surface, said pixel including:
   a photogenerative element formed of a given number of layers of semiconductor alloy material and providing a detectible signal corresponding to the quantity of radiation incident thereupon;
   at least one blocking element formed on the same number of layers of semiconductor alloy material as the photogenerative layer and electrically connected to the photogenerative element so as to selectively block the flow of current thereto;
   said blocking element including a photogenerative region at least partially unshielded from said incident radiation; and
   said photogenerative element and said blocking element closely spaced relative to one another so as to receive radiation from substantially the same portion of the image-bearing surface.

2. An element as in claim 1, wherein said photogenerative element is a photoresistor.

3. An element as in claim 1, wherein said photogenerative element is a phototransistor.

4. An element as in claim 1, wherein said photogenerative element is a photodiode.

5. An element as in claim 4, wherein said photodiode includes oppositely doped layers formed of thin film semiconductor alloy material.

6. An element as in claim 5, wherein said photodiode further includes a layer formed of substantially intrinsic semiconductor alloy material interposed between said oppositely doped layers so as to form a p-i-n type photodiode.

7. An element as in claim 6, wherein at least one of the semiconductor layers of said p-i-n type photodiode is formed from a material chosen from the group consisting essentially of: amorphous silicon alloy materials, amorphous germanium alloy materials, and amorphous silicon: germanium alloy materials.

8. An element as in claim 1, wherein said blocking element includes a layer of photoresponsive semiconductor alloy material capable of generating charge carrier pairs in response to the absorption of incident radiation.

9. An element as in claim 1, wherein said blocking element is a transistor.

10. An element as in claim 1, wherein said blocking element is a diode.

11. An element as in claim 10, wherein said diode includes a pair of oppositely doped layers of thin film semiconductor alloy material.

12. An element as in claim 11, wherein said diode includes a layer of intrinsic semiconductor alloy material interposed between said oppositely doped layers so as to provide a p-i-n type diode.

13. An element as in claim 12, wherein said p-i-n type diode includes at least one layer of semiconductor alloy material chosen from the group consisting essentially of: amorphous silicon alloy materials, amorphous germanium alloy materials, and amorphous silicon:germanium alloy materials.

14. An element as in claim 10, wherein said diode is a Schottky barrier diode.

15. An element as in claim 1, further including means for maintaining the second electrode of the photogenerative element and the second electrode of the current blocking element at a substantially equal potential.

16. An element as in claim 15, wherein said potential maintaining means maintains a potential of approximately 0 volts.

17. An element as in claim 15, wherein said potential maintaining means includes a low impedance current amplifier.

18. An element as in claim 1, wherein said photogenerative element is a photodiode having an anode and a cathode;

said blocking element is a blocking diode having an anode and cathode;

the cathodes of the photodiode and the blocking diode are electrically interconnected by an electrical conductor so that upon exposure of the photodiode to radiation, an electrical signal in the form of photogenerated carrier pairs will be stored on said electrical conductor; and the anode of the photodiodes and the anode of the blocking diode are maintained at substantially similar electrical potentials while the circuit is exposed to radiation.

19. An element as in claim 18, further comprising a plurality of photodiodes and plurality of associated blocking diodes operatively disposed and arranged for use as an array of pixels, each pixel provides an electrical signal corresponding to the quantity of radiation incident thereupon.

20. An element as in claim 19, wherein said array of pixels is linear.

21. An element as in claim 18, wherein the relative surface areas of the blocking diode to the photodiode differs by a factor of at least 5.

* * * * *